United States Patent
Yamamoto et al.

(10) Patent No.: US 7,432,551 B2
(45) Date of Patent: Oct. 7, 2008

(54) SOI SEMICONDUCTOR DEVICE INCLUDING A GUARD RING REGION

(75) Inventors: Ryota Yamamoto, Kanagawa (JP); Yutaka Akiyama, Kanagawa (JP); Masayuki Furumiya, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 258 days.

(21) Appl. No.: 11/362,132

(22) Filed: Feb. 27, 2006

(65) Prior Publication Data

US 2006/0197127 A1    Sep. 7, 2006

(30) Foreign Application Priority Data

Mar. 2, 2005    (JP) ............................. 2005-057294

(51) Int. Cl.
*H01L 27/01*    (2006.01)
(52) U.S. Cl. ............... 257/347; 257/409; 257/E27.112; 257/E29.063
(58) Field of Classification Search ................. 257/347, 257/409, E27.112, E29.063
See application file for complete search history.

(56) References Cited

U.S. PATENT DOCUMENTS

| | | | |
|---|---|---|---|
| 6,355,537 B1 * | 3/2002 | Seefeldt ...................... | 438/405 |
| 6,429,502 B1 * | 8/2002 | Librizzi et al. ............... | 257/510 |
| 6,459,134 B2 * | 10/2002 | Ohguro et al. ............... | 257/501 |
| 7,339,249 B2 * | 3/2008 | Yamamoto et al. .......... | 257/504 |
| 2004/0089901 A1 * | 5/2004 | Ohkubo et al. .............. | 257/347 |
| 2004/0129977 A1 * | 7/2004 | Ohkubo et al. .............. | 257/347 |
| 2005/0189602 A1 * | 9/2005 | Yamamoto et al. .......... | 257/494 |

OTHER PUBLICATIONS

Jean-Pierre Raskin et al., "Substrate Crosstalk Reduction Using SOI Technology", IEEE Transactions on Electron Devices, vol. 44, No. 12, Dec. 1997, pp. 2252-2261.

* cited by examiner

*Primary Examiner*—Charles D. Garber
*Assistant Examiner*—Stanetta D Isaac
(74) *Attorney, Agent, or Firm*—Young & Thompson

(57) ABSTRACT

An object is to increase the amount of substrate noise absorbed in a guard ring, and to prevent a malfunction caused by the substrate noise in a semiconductor device including an SOI substrate provided with the guard ring. Then, there is provided a semiconductor device, including: an SOI substrate in which a support substrate 10, an insulating layer 11, and an SOI layer 12 are stacked one by one; an element section 4 provided in one region of the SOI substrate; and a guard ring region 8 provided around the element section 4 of the SOI substrate, wherein a first diffusion layer 15 provided in the SOI layer 12 of the element section 4, and a second diffusion layer 26 provided in the SOI layer 12 of the guard ring region 8 are electrically connected to each other.

7 Claims, 14 Drawing Sheets

US 7,432,551 B2

SOI SEMICONDUCTOR DEVICE INCLUDING A GUARD RING REGION

This application is based on Japanese Patent application NO. 2005-057294, the content of which is incorporated hereinto by reference.

BACKGROUND

1. Technical Field

The present invention relates to a semiconductor device using a silicon oxide insulator (SOI) substrate, and, more particularly, to a semiconductor device provided with a guard ring intended for reduction of substrate noise.

2. Related Art

Conventionally, for reduction of the substrate noise, there has been used in a semiconductor device a technology by which the surrounding of an element section is enclosed with a guard ring including a P+ type diffusion layer fixed to a ground potential GND (or, N+ type diffusion layer fixed to a power supply VDD) (refer to, for example, J. Raskin, et. al, "Substrate Crosstalk Reduction Using SOI Technology", IEEE Trans. Electron Devices, December 1997, vol. 44, No. 12, pp. 2252-2261.).

Hereinafter, problems to be solved by the present invention will be explained, referring to drawings. And, similar components in all the drawings will be denoted by the same reference numerals, and the explanation will not be properly described.

FIGS. 9A and 9B are schematic plan views showing how substrate noise is transmitted between two element sections in a semiconductor device with the two element sections of an area in which a semiconductor element is formed. An arrow in the drawing denotes the transmission direction of the substrate noise. A semiconductor device 100 in FIG. 9A has: an element section 102 as a source in which the substrate noise is generated; an element section 104 to be affected by the substrate noise; and an element isolation region 106 located between the above element sections 102 and 104. On the other hand, a semiconductor device 200 in FIG. 9B is provided with: an element section 102 as a source in which the substrate noise is generated; an element section 104 to be affected by the substrate noise; and a guard ring region 108 so as to enclose the surrounding of the element section 104. Furthermore, an element isolation region 106 is formed between the section and the region.

FIG. 10 is a cross-sectional view taken on the B-B line in FIG. 9A, and shows an example of a semiconductor device using a bulk substrate which is not provided with a guard ring.

As shown in FIG. 10, a semiconductor device 100a has a P type well layer 112 of a diffusion layer on a support substrate 110. A first diffusion layer 115 is formed on the support substrate 110 in an element section 104. The first diffusion layer 115 includes: a P type well layer 112a; and a P+ type diffusion layer 116a provided on the P type well layer 112a. In the element isolation region 106, an element separation layer (hereinafter, called a shallow trench isolation layer (STI layer)) 114 is provided on the P type well layer 112d. This P type well layer 112d is formed integral with the P type well layer 112a of the first diffusion layer 115 to form the P type well layer 112.

A substrate contact 118 is connected onto the P+ type diffusion layer 116a. The substrate contact 118 is connected to a ground interconnection GND2. That is, the first diffusion layer 115 is fixed to ground potential. Accordingly, when substrate noise transmits through the P type well layer 112 from the element section 102 in the direction of the arrow in the semiconductor device 100a shown in FIG. 10, the substrate noise directly transmits to the substrate contact 118 through the first diffusion layer 115 to change the potential between the power supply and the ground potential GND in the element section 104. This change in the potential causes a malfunction of circuit operation, for example, an increase in jitter of an oscillator in an element section 104.

FIG. 11 is a cross-sectional view taken on the C-C line in FIG. 9B and shows an example of a semiconductor device using a bulk substrate provided with a guard ring.

As shown in FIG. 11, a semiconductor device 200a has a P type well layer 112 of a diffusion layer on a support substrate 110. A first diffusion layer 115 is formed in the element section 104 in a similar manner to the above layer 112. Furthermore, a second diffusion layer (hereinafter, simply called a guard ring) 122 is formed on the support substrate 110 in the guard ring region 108. The second diffusion layer 122 includes: a P type well layer 112b; and a P+ type diffusion layer 116b provided on the P type well layer 112b. A STI layer 114 is formed between the first diffusion layer 115 and the second diffusion layer 122, and these diffusion layers are provided a predetermined distance away from each other across the layer 114. The first diffusion layer 115 and the second diffusion layer 122 are electrically connected to each other by P type well layer 112c formed between the P type well layer 112a and the P type well layer 112b. This P type well layers 112a, 112b, 112c, and 112d are integral with one another to form the P type well layer 112.

A substrate contact 118 is connected onto the P+ type diffusion layer 116a. The substrate contact 118 is connected to a ground interconnection GND2. That is, the first diffusion layer 115 is fixed to ground potential. On the other hand, the P+ type diffusion layer 116b is electrically connected to a contact 120 on the surface. This contact 120 is connected to a ground interconnection GND1. That is, the second diffusion layer 122 is fixed to the ground potential. Here, the ground interconnections GND1 and GND2 are separated from each other.

When substrate noise transmits through the P type well layer 112 from the element section 102 in the direction of the arrow in the semiconductor device 200a shown in FIG. 11, the substrate noise transmits to the substrate contact 120 fixed to the ground potential through the second diffusion layer 122. Accordingly, the substrate noise transmitted to the substrate contact 118 in the element section is more greatly reduced in comparison with the case of the semiconductor device 100a shown in FIG. 10. Thereby, stable operation may be realized in circuits of the element section to cause extremely few malfunction.

FIG. 12 is a cross-sectional view taken on the B-B line in FIG. 9A, and shows an example of a semiconductor device using an SOI (Silicon On Insualtion) substrate which is not provided with a guard ring.

As shown in FIG. 12, a silicon oxidation insulating layer (hereinafter, called a buried oxide (BOX) layer) 111 is formed on a support substrate 110 in a semiconductor device 100b. After an SOI layer 113 is formed on the BOX layer 111 according to an epitaxial method, a first diffusion layer 115 is formed in an element section 104 according to a common method. The first diffusion layer 115 includes: a P type well layer 112a; and a P+ type diffusion layer 116a provided on the P type well layer 112a. In the element isolation region 106, an STI layer 114 is provided on the BOX layer 111. A substrate contact 118 is connected onto the P+ type diffusion layer 116a. The substrate contact 118 is connected to a ground interconnection GND2. That is, the first diffusion layer 115 is fixed to ground potential.

Substrate noise transmits on the support substrate 110 from the element section 102 in the direction of the arrow in the semiconductor device 100b shown in FIG. 12. Since the BOX layer 111 and the STI layer 114 are in contact with each other in the element isolation region 106, this substrate noise does not transmit in the upward direction. On the other hand, only high-frequency components in the substrate noise transmit through the BOX layer 111 in the upper direction, and, furthermore, to the first diffusion layer 115 because low-frequency components in the substrate noise are cut-off by the BOX layer 111 in the element section 104 in which the first diffusion layer 115 is formed. Accordingly, the substrate noise, which is transmitted to the substrate contact 118 in the semiconductor device 100b, is more reduced in comparison with the case of the semiconductor device 100a shown in FIG. 10.

FIG. 13 is a cross-sectional view taken on the C-C line in FIG. 9B, and shows an example of a semiconductor device using an SOI substrate provided with a guard ring.

As shown in FIG. 13, in an element section 104, a semiconductor device 200b has a first diffusion layer 115 on a BOX layer 111 in a similar manner to that of the semiconductor device 200a shown in FIG. 11. Furthermore, a second diffusion layer 122 is formed on the BOX layer 111 in a guard ring region 108. The second diffusion layer 122 includes: a P type well layer 112b; and a P+ type diffusion layer 116b formed on the P type well layer 112b. The first diffusion layer 115 and the second diffusion layer 122 are provided a predetermined distance away from each other across an STI layer 114. A substrate contact 118 is connected onto a P+ type diffusion layer 116a. The substrate contact 118 is connected to a ground interconnection GND2. That is, the first diffusion layer 115 is fixed to ground potential. On the other hand, the upper surface of the P+ type diffusion layer 116b is electrically connected to a contact 120. The above contact 120 is connected to a ground interconnection GND1. That is, the second diffusion layer 122 is fixed to the ground potential. Here, the ground interconnections GND1 and GND2 are separated from each other.

Substrate noise transmits on a support substrate 110 from the element section 102 in the direction of the arrow in the semiconductor device 200b shown in FIG. 13. In this case, before high-frequency components in the substrate noise reaches the substrate contact 118 in a semiconductor element, the high-frequency components transmit through the BOX layer 111 in the upper direction, and, furthermore, through the second diffusion layer 122, and are absorbed into the ground interconnection GND1 through the contact 120. Accordingly, the substrate noise transmitted to the substrate contact 118 in the element section is more reduced than the case of the semiconductor device 100b shown in FIG. 12.

However, the semiconductor device 200b using the SOI substrate provided with the guard ring has the following problem. That is, when a guard ring region 108 is formed in a semiconductor device using an SOI substrate in a similar manner to the case of the semiconductor device 200b shown in FIG. 13, less effects in absorbing the substrate noise are caused in comparison with those in the case of the guard ring of the semiconductor device 200a shown in FIG. 11. Accordingly, a semiconductor device using an SOI substrate is required to prevent a malfunction caused by the substrate noise.

The above-described problem will be clarified, using measurement results (diagrams) shown in FIGS. 14A and 14B. The vertical axis represents the level of the substrate noise, which is measured at the substrate contact 118 in the semiconductor element, and the horizontal axis denotes a distance between the noise source and the substrate contact 118 in the semiconductor element. In the diagram of FIG. 14A, the cross-sectional view of the structure for the semiconductor device described as "bulk substrate" is shown in FIG. 10, and the cross-sectional view of the structure for the semiconductor device described as "SOI" is shown in FIG. 12. Furthermore, in the diagram of FIG. 14B, the cross-sectional view of the structure for the semiconductor device described as "bulk substrate" is shown in FIG. 11, and the cross-sectional view of the structure for the semiconductor device described as "SOI" is shown in FIG. 13.

As seen from FIG. 14A, with regard to the level of the substrate noise measured at the substrate contact 118, the level of the "SOI substrate (FIG. 12)" is extremely lower than that of the "bulk substrate (FIG. 10)" in the semiconductor device which is not provided with the guard ring.

However, as seen from FIG. 14B, with regard to the level of the substrate noise measured at the substrate contact 118, "SOI substrate (FIG. 13)" is, in most distances, higher than that of the "bulk substrate (FIG. 11)" in the semiconductor device provided with the guard ring.

That is, in the element section 104 and the guard ring region 108 shown in FIG. 13, the low-frequency components in the substrate noise do not transmit in the BOX layer 111, and the high-frequency components transmit therein in the upward direction to the first diffusion layer 115 and the second diffusion layer 122. However, in the SOI substrate, the second diffusion layer 122 to which the contact 120 is electrically connected is enclosed with the STI layer 114 and the BOX layer 111 to be in an electrically isolated state. Therefore, in the element section 104, the level of the substrate noise at the substrate contact 118 becomes high because the substrate noise absorbed in the first diffusion layer 115 may not be moved to the second diffusion layer 122.

That is, there is a possibility that the high-frequency components of the substrate noise absorbed in the first diffusion layer 115 transmit to the substrate contact 118, and change the potential between the power supply and the ground potential GND in the semiconductor element. The above change in the potential causes a malfunction of circuit operation, for example, an increase in jitter of an oscillator in the semiconductor element. Accordingly, a semiconductor device including the SOI substrate provided with the guard ring is required to increase the amount of the substrate noise absorbed by the guard ring, and to prevent a malfunction caused by the substrate noise.

SUMMARY OF THE INVENTION

According to the present invention, there is provided a semiconductor device including: an SOI substrate in which a support substrate, an insulating layer, and an SOI layer are stacked one by one; an element section which is provided in one region of the SOI substrate; and a guard ring region provided around the element section of the SOI substrate, wherein a first diffusion layer provided in the SOI layer of the element section, and a second diffusion layer provided in the SOI layer of the guard ring region are electrically connected to each other.

According to the semiconductor device using the above-described SOI substrate, the diffusion layer (guard ring) in the guard ring region, wherein the contact is connected to the diffusion layer, and the semiconductor element are electrically connected to each other. Thereby, the amount of substrate noise absorbed in a guard ring is increased, and the substrate noise in the SOI substrate may be reduced.

In the semiconductor device according to the present invention, the amount of the substrate noise absorbed in the guard ring is increased, because the diffusion layer (guard ring) in the guard ring region, and the diffusion layer in the element section are electrically connected to each other. Accordingly, the substrate noise in the SOI substrate may be reduced.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, embodiments according to the present invention will be explained in detail, referring to attached drawings.

Figure 1:
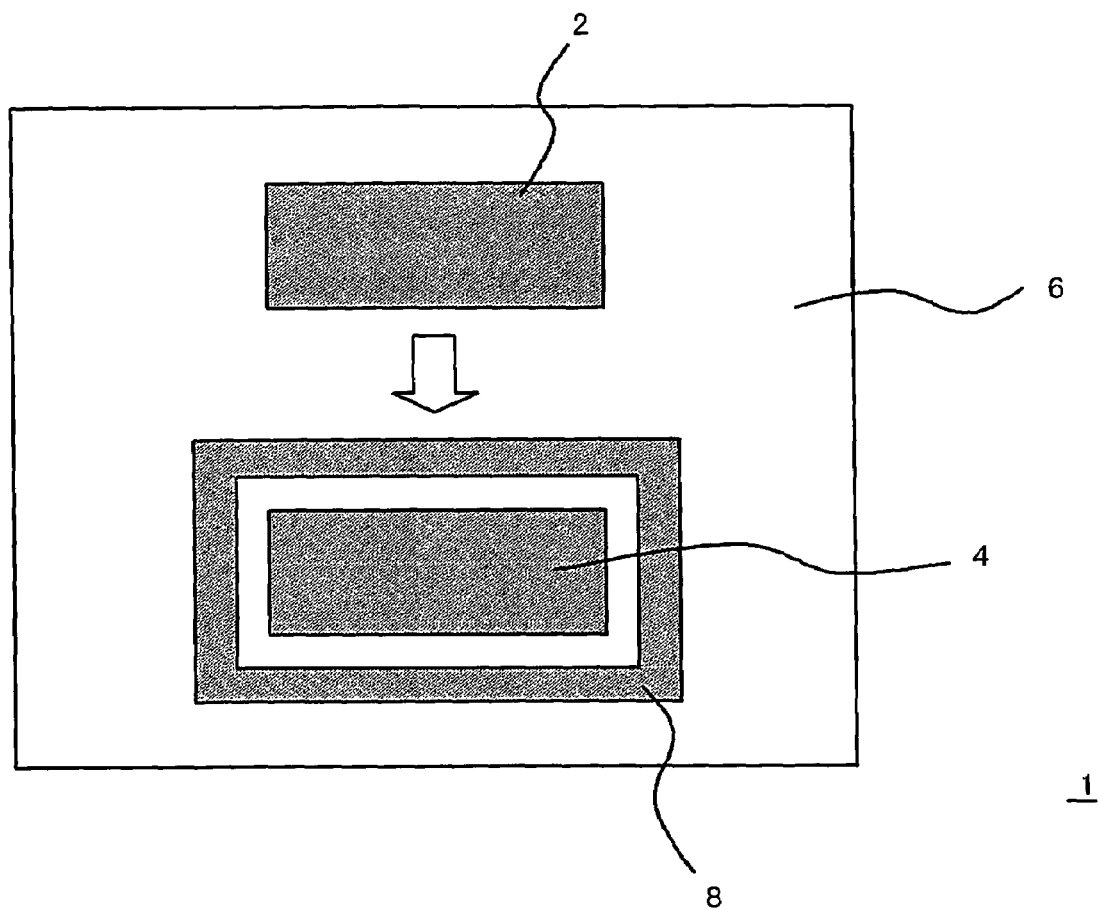
FIG. 1 is a schematic top view of a semiconductor device using an SOI substrate according to the present invention.

A semiconductor device 1 using an SOI substrate according to the present invention has as shown in FIG. 1: an element section 2 in which a semiconductor element as a source of substrate noise is formed on the SOI substrate; an element section 4 to be affected by the substrate noise; and a guard ring region 8 so as to enclose the surrounding of the element section 4. An element isolation region 6 is formed between the section and the region.

Figure 2:
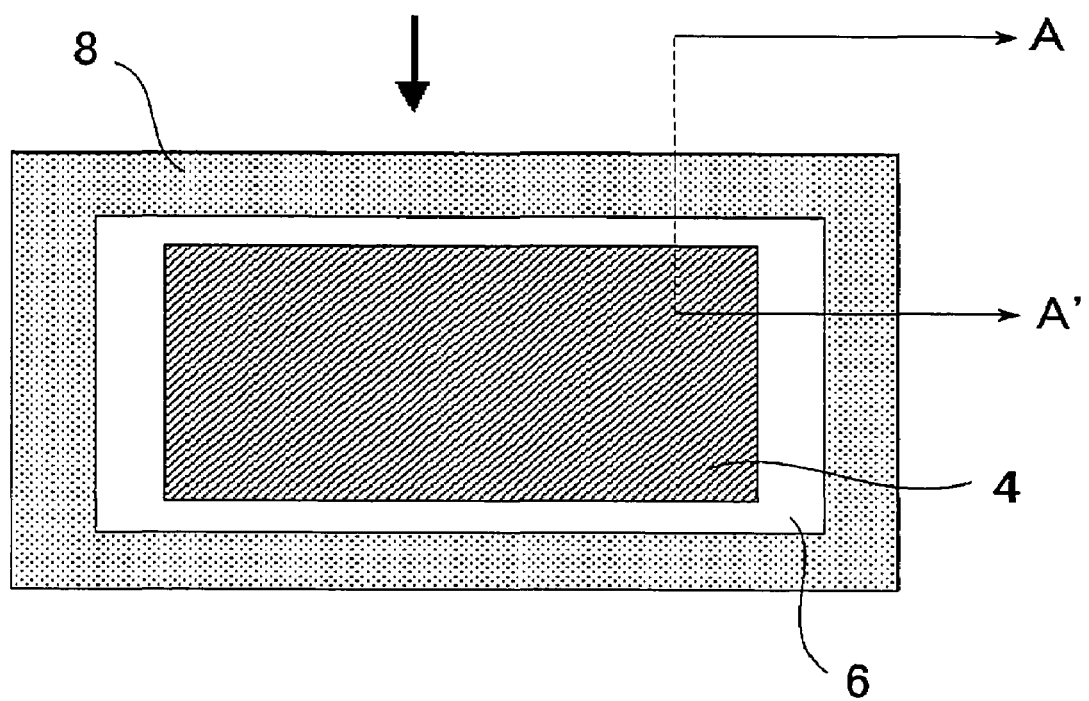
FIG. 2 is a partially enlarged view showing a relation between the position of an element section and that of an element isolation region, wherein the section and the region are provided in the semiconductor device shown in FIG. 1.
Figure 3:
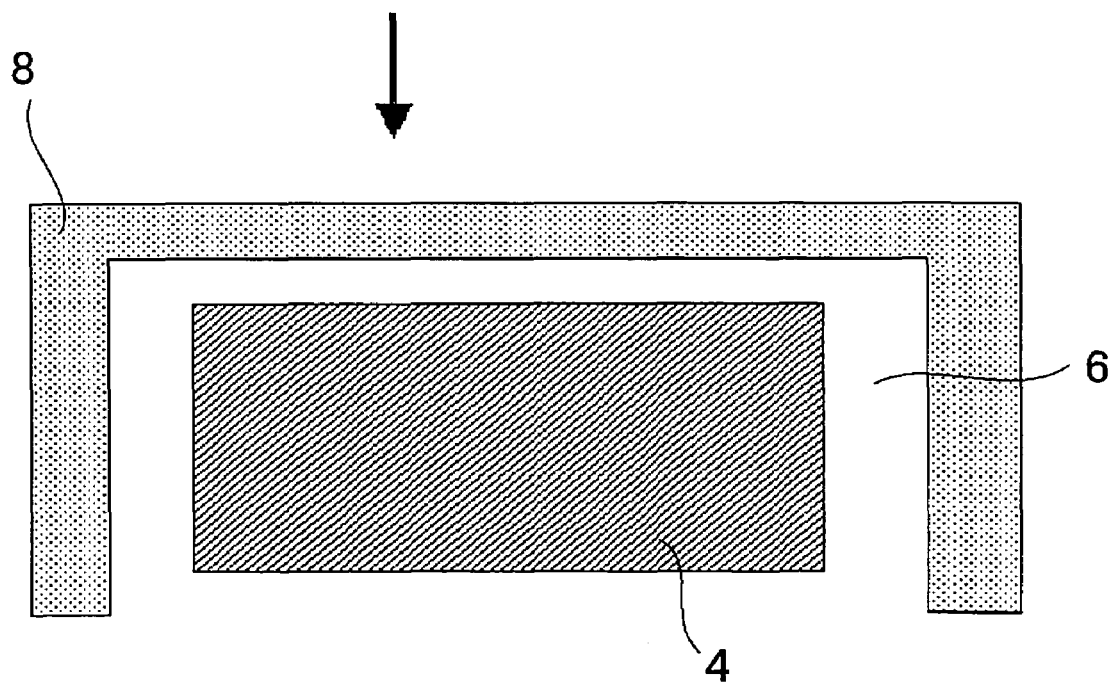
FIG. 3 is a partially enlarged view showing another relation between the position of the element section and that of the element isolation region.
Figure 4:
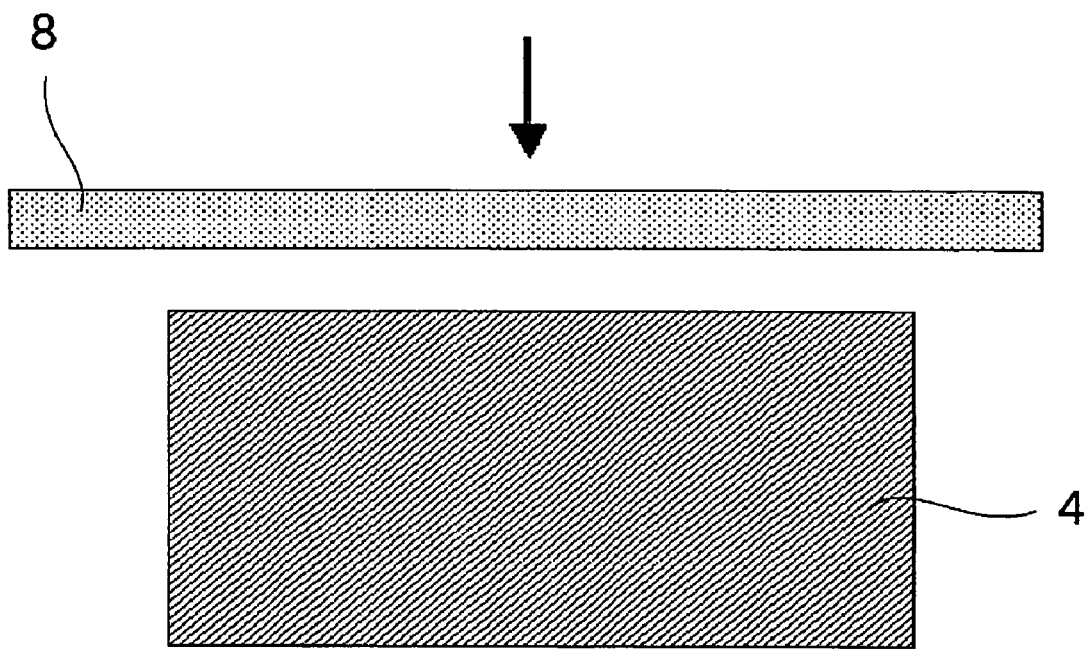
FIG. 4 is a partially enlarged view showing further another relation between the position of the element section and that of the element isolation region.

FIG. 2 is a partially enlarged view showing a relation between the position of the element section 4 and that of the element isolation region 6, wherein the section 4 and the region 6 are provided in the semiconductor device 1 shown in FIG. 1. As described above, the substrate noise may be efficiently reduced when there is provided the guard ring region 8 so as to enclose the surrounding of the element section 4. Furthermore, the guard ring region 8 may have an approximately U-shape configuration in which the region 8 does not guard a part of the element section 4 as shown in FIG. 3 when it is difficult, considering a space for layout and the like, to form the guard ring region 8 so as to enclose the element section 4 in a complete manner as shown in FIG. 2. In this case, more improved effects in noise reduction is produced when the guard ring region 8 is facing the noise source (element section 2). Therefore, it is preferable that a portion without the guard ring region 8 does not face the noise source. Moreover, the guard ring region 8 may have an approximately narrow-strip configuration as shown in FIG. 4. In such a case, it is preferable by the same reason that the guard ring region 8 is arranged between the noise source and the element section 4.

Figure 5:
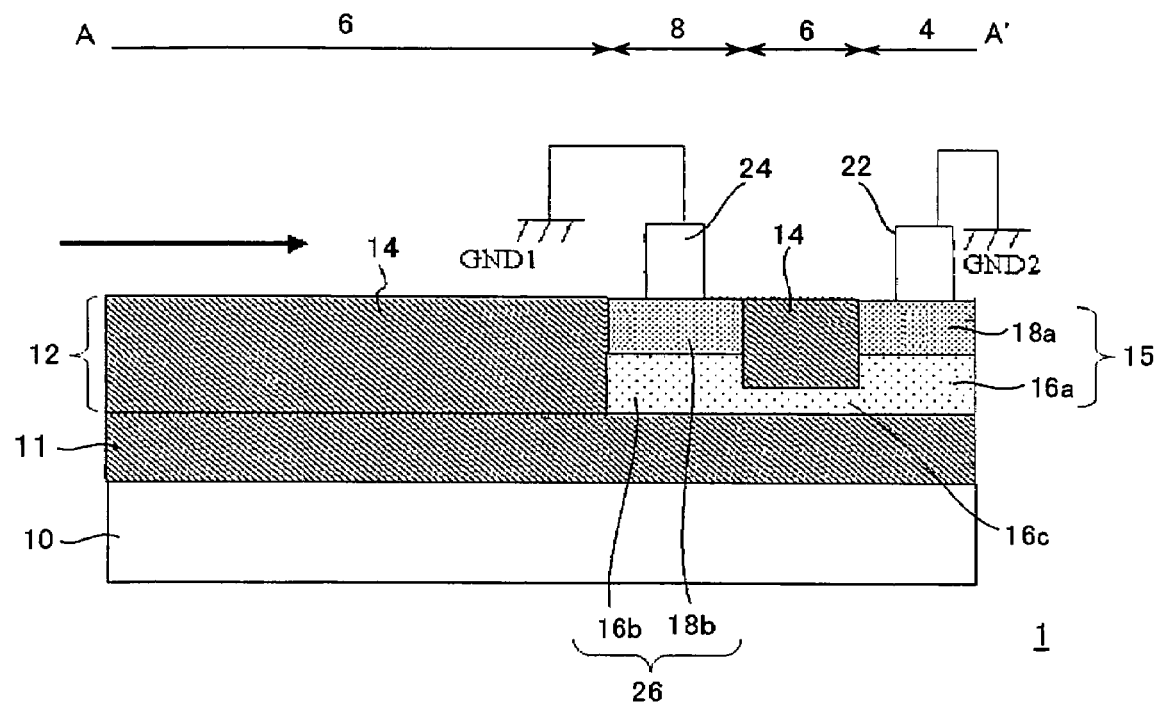
FIG. 5 is a cross-sectional view taken on the A-A line of the semiconductor device in FIG. 2 (example 1)

FIG. 5 shows a cross-sectional view taken on the A-A line of the semiconductor device 1 in FIG. 2.

As shown in FIG. 5, a support substrate 10, a BOX layer 11 provided as an insulating layer on the support substrate 10, and an SOI layer 12 provided on the BOX layer 11 are stacked in the semiconductor device 1. A first diffusion layer 15 is formed in the SOI layer 12 in the element section 4 according to a common method. The BOX layer 11 is, for example, 90 nm in thickness.

The SOI layer 12 of the element section 4 has a P type well 16a, and a P+ type diffusion layer 18a on the P type well 16a to form the first diffusion layer 15. A substrate contact 22 is connected onto the upper surface of the P+ type diffusion layer 18a. The substrate contact 22 is connected to a ground interconnection GND2. Thereby, the first diffusion layer 15 is fixed to a ground potential.

The SOI layer 12 in the guard ring region 8 has a P+ type diffusion layer 18b on the P type well 16b to form a second diffusion layer (hereinafter, simply called a guard ring) 26. A contact 24 is connected onto the upper surface of the P+ type diffusion layer 18b. The contact 24 is connected to a ground interconnection GND1. Thereby, the second diffusion layer 26 is fixed to the ground potential. The larger forming density of the contacts connected to the guard ring region 8 causes the resistance of each substrate contact to become smaller, and the substrate noise may be efficiently reduced. Accordingly, it is preferable that the forming density is the maximum acceptable value according to a design rule. Here, the ground interconnections GND1 and GND2 are separated from each other.

In the SOI layer 12 of the element isolation region 6, an element separation layer (hereinafter, called a shallow trench isolation (STI) layer) 14 is provided on the BOX layer 11. Furthermore, the STI layer 14 is formed between the first diffusion layer 15 and the second diffusion layer 26, and these diffusion layers 15 and 26 are provided a predetermined distance away from each other across the layer 14. The STI layer 14 formed between the first and the second diffusion layers does not reach the BOX layer 11, and a third diffusion layer 16c is provided in the SOI layer 12 between the BOX layer 11 and the STI layer 14. The first diffusion layer 15 and the second diffusion layer 26 are electrically connected to each other through the third diffusion layer 16c. Since the third diffusion layer 16c is formed in the SOI layer 12, the resistance of the SOI layer 12 may be reduced, and the substrate noise may efficiently transmit to the second diffusion layer 26. In the present example, a P type well is formed as the third diffusion layer 16c. The third diffusion layer 16c is, for example, 28 nm in thickness. Here, the first diffusion layer 15, the second diffusion layer 26, and the third diffusion layer 16c may not form a diffusion layer unless the effects according to the present invention are impaired.

Thus, in the semiconductor device 1 using the SOI substrate, the high-frequency components of the substrate noise which transmits to the first diffusion layer 15 may be configured to transmit to the second diffusion layer 26 by electrically connecting the first diffusion layer 15 and the second diffusion layer 26 through the third diffusion layer 16c. Accordingly, the level of the substrate noise transmitting to the substrate contact 22, which is connected to the first diffusion layer 15, may be reduced, and a malfunction of the semiconductor element caused by the substrate noise may be prevented.

In the semiconductor device 1 according to the present invention, it is preferable that the width of the guard ring region 8 is wider within an acceptable range according to a design rule, because the wider width causes the effect in absorbing the substrate noise to be more improved. Moreover, it is preferable that a distance between the first diffusion layer 15 and the second diffusion layer 26 is shorter within an acceptable range according to a design rule, because the shorter distance causes the effect in absorbing the substrate noise to be more improved.

Subsequently, the effects of the semiconductor device 1 according to the present invention will be explained, referring to measurement results shown in FIG. 8A and FIG. 8B.

Figure 8A:
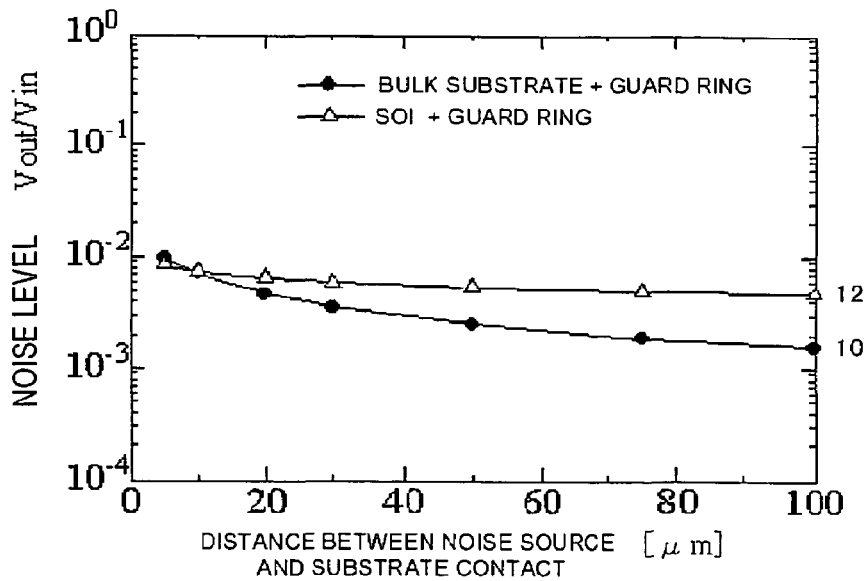
FIG. 8A is a diagram showing measurement results of substrate noise at a substrate contact in a semiconductor device.
Figure 8B:
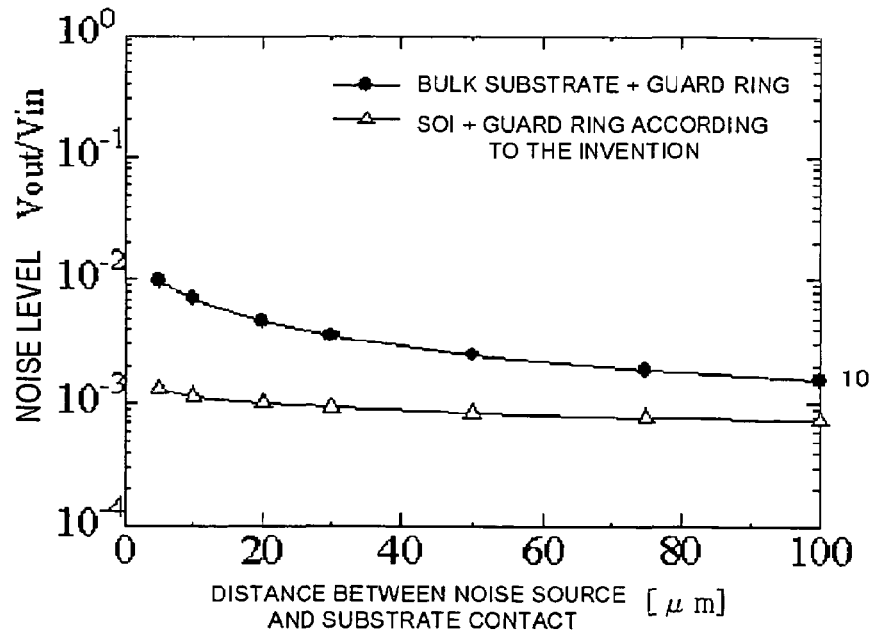
FIG. 8B is a diagram showing measurement results of substrate noise at a substrate contact in another semiconductor device.
Figure 9A:
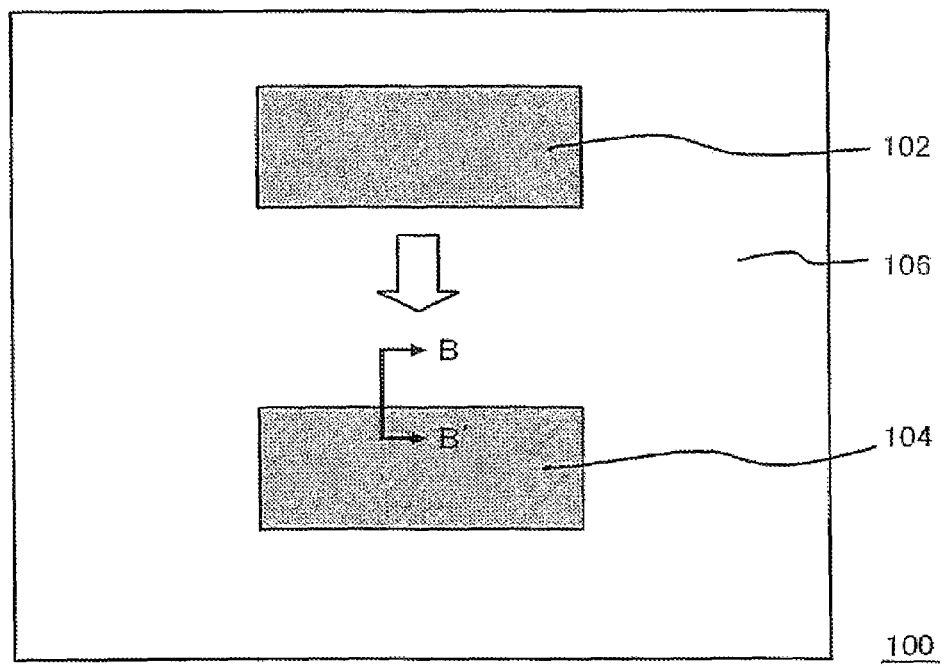
FIGS. 9A and 9B are schematic plan views showing how substrate noise is transmitted between two element sections in a semiconductor device.
Figure 9B:
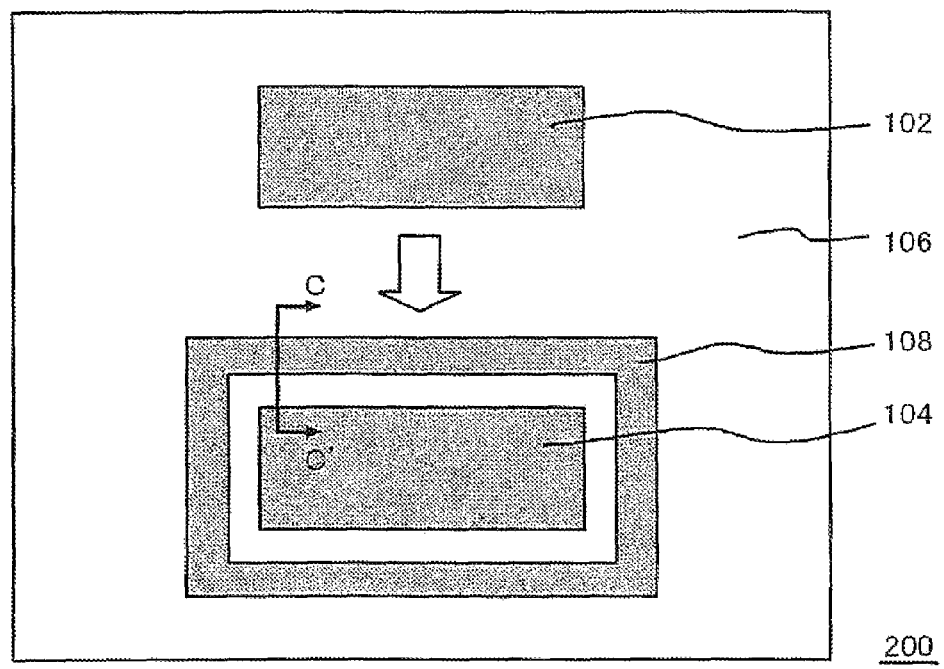
Figure 10:
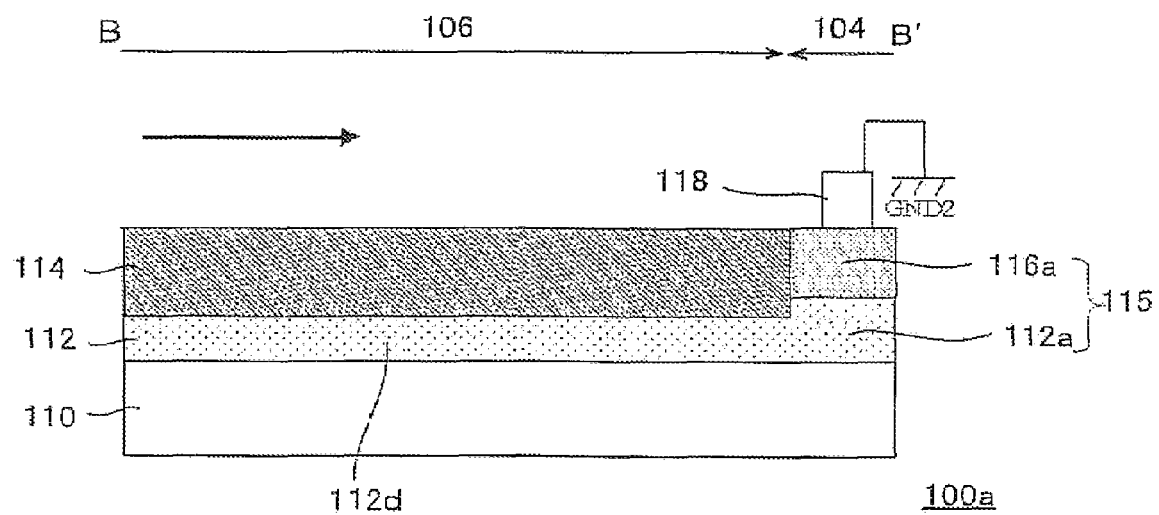
FIG. 10 is a cross-sectional view taken on the B-B line in FIG. 9A, and shows a semiconductor device using a bulk substrate which is not provided with a guard ring.
Figure 11:
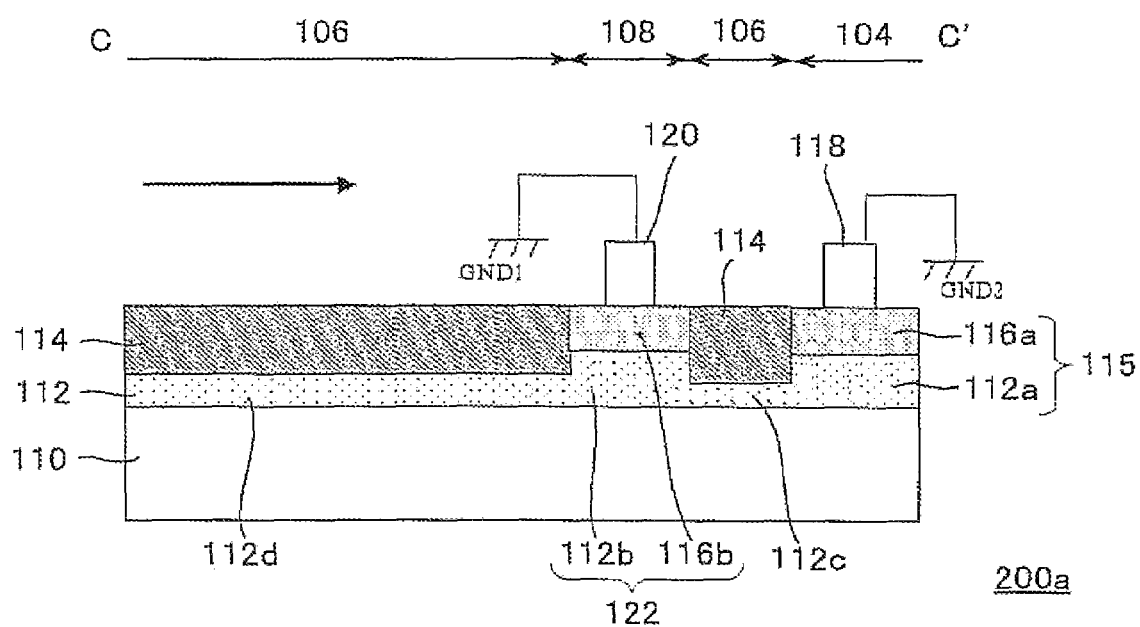
FIG. 11 is a cross-sectional view taken on the C-C line in FIG. 9B, and shows a semiconductor device using a bulk substrate provided with a guard ring.
Figure 12:
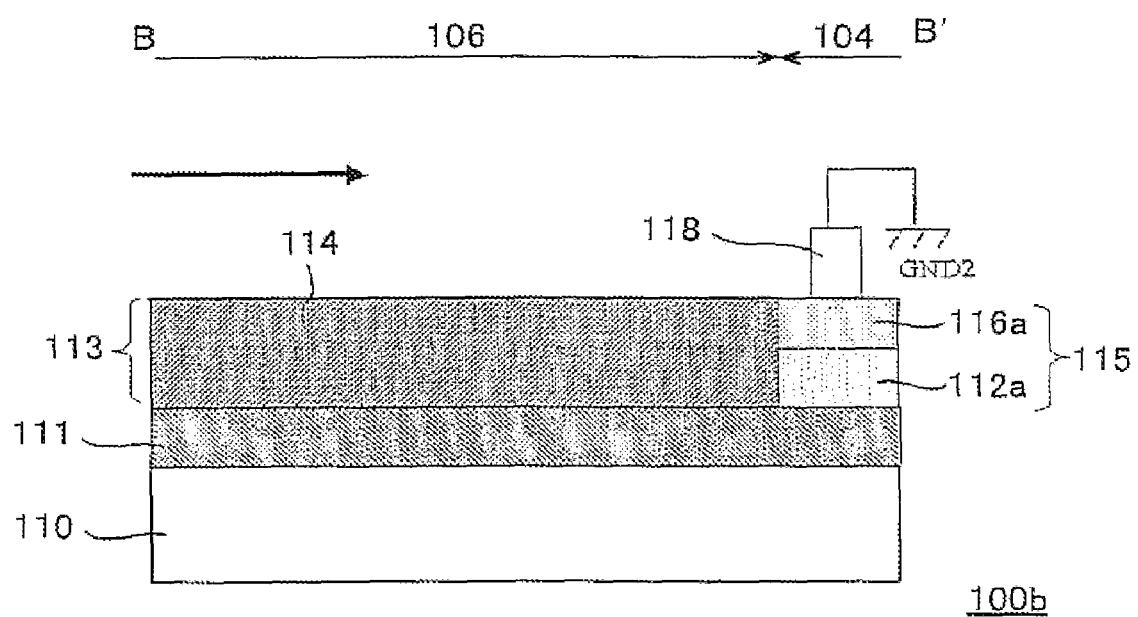
FIG. 12 is a cross-sectional view taken on the B-B line in FIG. 9A, and shows a semiconductor device using an SOI substrate.
Figure 13:
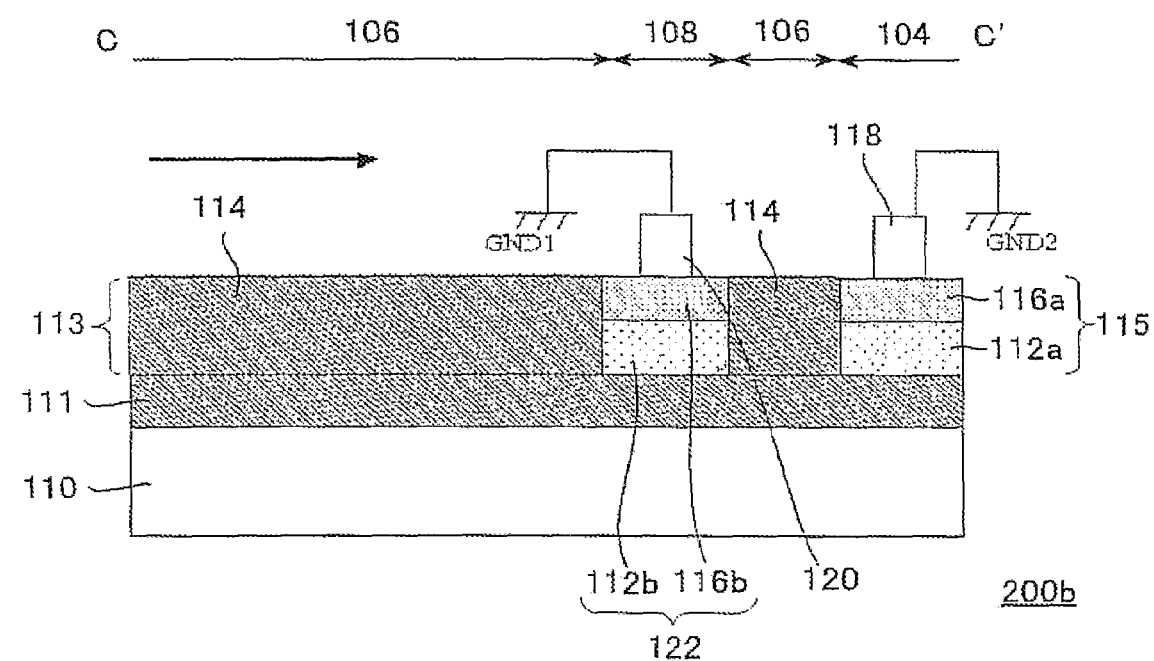
FIG. 13 is a cross-sectional view taken on the C-C line in FIG. 9B, and shows a semiconductor device using an SOI substrate provided with a guard ring.
Figure 14A:
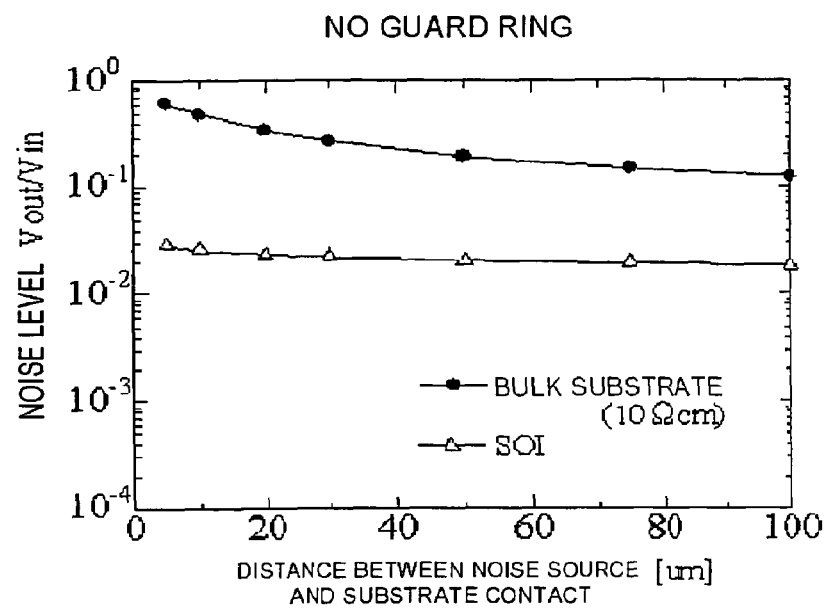
FIG. 14A is a diagram showing measurement results of substrate noise at a substrate contact in a semiconductor device.
Figure 14B:
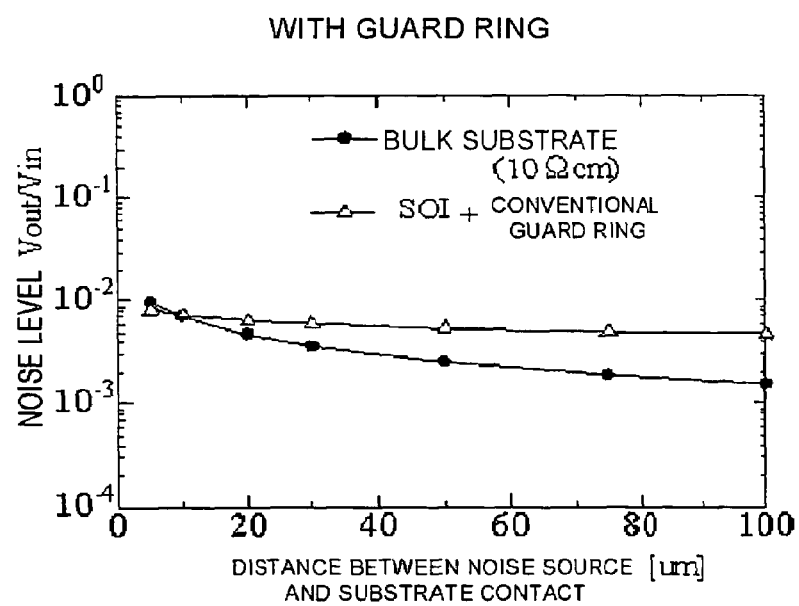
FIG. 14B is a diagram showing measurement results of substrate noise at a substrate contact in another semiconductor device.

In the diagrams shown in FIGS. 8A and 8B, the vertical axis represents the level of the substrate noise, which is measured at the substrate contact in the semiconductor element, and the horizontal axis denotes a distance between the noise source and the substrate contact in the semiconductor element. In the diagram of FIG. 8A, the semiconductor device described as "bulk substrate+guard ring" represents the semiconductor device with the cross-sectional structure shown in FIG. 11, and the semiconductor device described as "SOI+ guard ring" denotes the semiconductor device with the cross-sectional structure shown in FIG. 13. Moreover, in the diagram of FIG. 8B, the semiconductor device described as "bulk substrate +guard ring" represents the semiconductor device with the cross-sectional structure shown in FIG. 11, and the semiconductor device described as "SOI+guard ring according to the invention" denotes the semiconductor device with the cross-sectional structure shown in FIG. 5.

As seen from the diagrams (measurement results) shown in FIGS. 8A and 8B, the amount of the substrate noise measured at the substrate contact 22 is reduced by connecting the first diffusion layer 15 and the second diffusion layer 26 in an electrical manner through the third diffusion layer 16c.

That is, in the element section 4 and the guard ring region 8, the low-frequency components in the substrate noise do not transmit in the BOX layer 11, and the high-frequency components transmit therein in the upward direction to the first diffusion layer 15 and the second diffusion layer 26. Therefore, in the case of the semiconductor device 200b shown in FIG. 13, the second diffusion layer 122 is enclosed with the STI layer 114 and the BOX layer 111 to be in an electrically isolated state because the semiconductor device 200b is not provided with the third diffusion layer 16c. Accordingly, the level of the substrate noise in the substrate contact is increased because the substrate noise absorbed in the first diffusion layer 115 may not be moved to the guard ring.

On the other hand, in the semiconductor device 1 according to the present invention the first diffusion layer 15 and the second diffusion layer 26 are electrically connected through the third diffusion layer 16c. Thereby, the amount of the high-frequency components of the substrate noise transmitted to the substrate contact 22 is reduced because the substrate noise transmitting in the first diffusion layer 15 transmits to the second diffusion layer 26. Accordingly, the potential between the power supply and the GND in the semiconductor element, and a malfunction of circuit operation is not caused.

Hereinafter, semiconductor devices 1 according to other embodiments of this invention will be explained. Here, the centerpiece of explanation will be structural points that are different from those of the above example 1, and explanation of similar components to those of the above example 1 will not be properly described.

In the first place, a semiconductor device 1 according to an example 2 will be explained.

Figure 6:
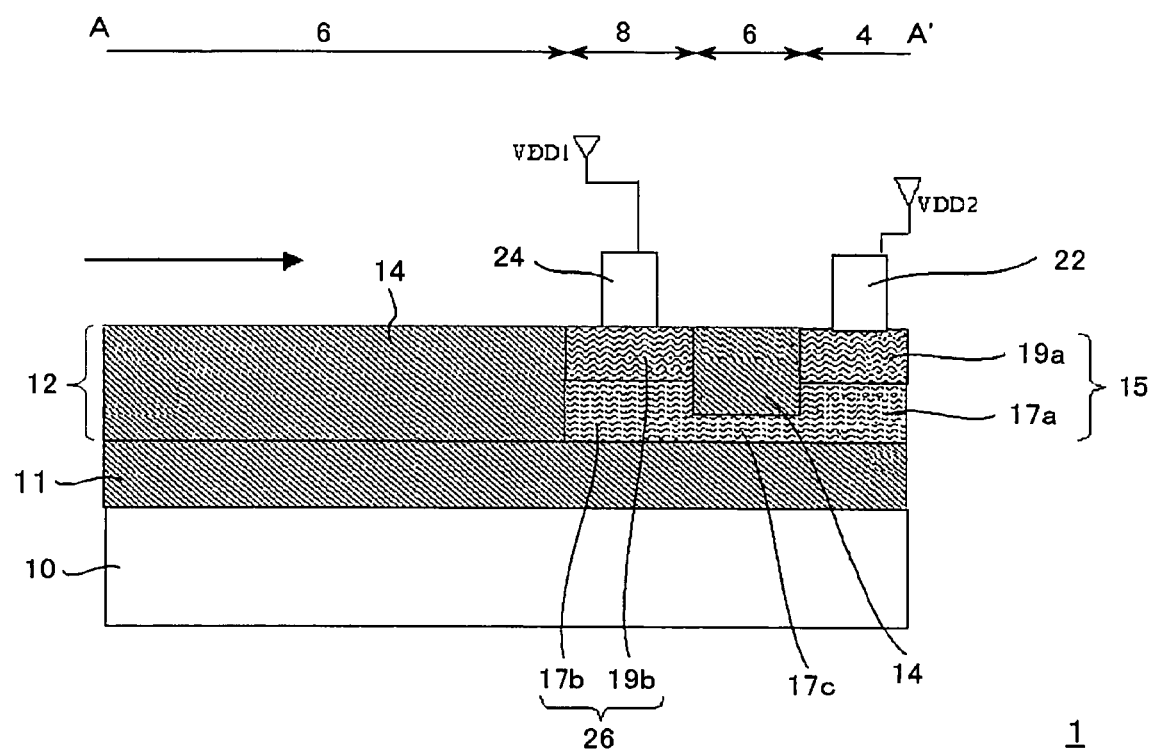
FIG. 6 is a cross-sectional view taken on the A-A line of the semiconductor device in FIG. 2 (example 2)

FIG. 6 shows a cross-sectional view taken on the A-A line of the semiconductor device 1 in FIG. 2 (example 2) with other structure.

In the semiconductor device 1, an element section 4 includes an N type well 17a, and an N+ type diffusion layer 19 thereon to form a first diffusion layer 15. A substrate contact 22 is connected onto the upper surface of an N+ type diffusion layer 19a. The substrate contact 22 is connected to a power supply VDD2.

In the semiconductor device 1, a guard ring region 8 includes an N type well 17b, and an N+ type diffusion layer 19b provided thereon to form a second diffusion layer 26. A contact 24 is connected to the upper surface of the N+ type diffusion layer 19b. The contact 24 is connected to a power supply VDD1. Here, the VDD1 and the VDD2 are separated from each other.

In an element isolation region 6 of the semiconductor device 1, an STI layer 14 is provided on a BOX layer 11 as an element separation layer. Furthermore, another STI layer 14 is also formed between the first diffusion layer 15 and the second diffusion layer 26, and these diffusion layers 15 and 26 are provided a predetermined distance away from each other across the layer 14. An N type well layer 17c is formed as an N type diffusion layer between the STI layer 14 and the BOX layer 11. The N type well layer 17c is, for example, 28 nm in thickness.

The N type well 17c is formed between the N type well 17a and the N type well 17b, and the first diffusion layer 15 and the second diffusion layer 26 are electrically connected to each other.

According to the semiconductor device 1 according to the present example 2, a semiconductor device with the same effect as that of the semiconductor according to the example 1 may be provided even when the N type well is used.

Subsequently, a semiconductor device 1 according to an example 3 will be explained.

Figure 7:
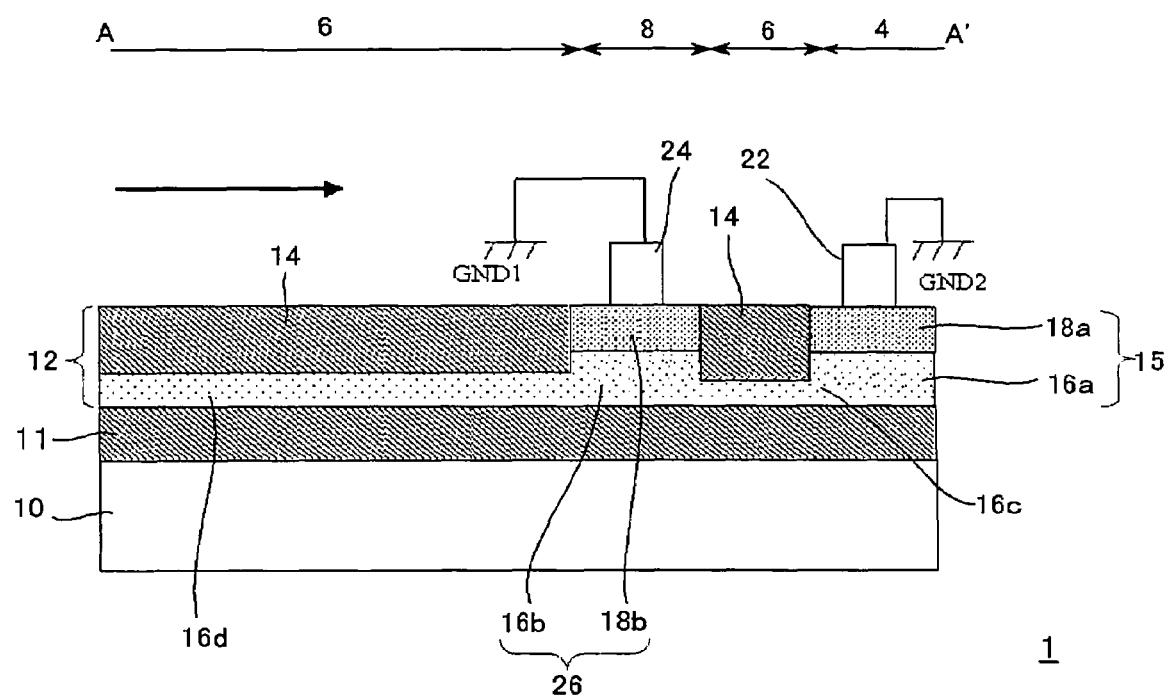
FIG. 7 is a cross-sectional view taken on the A-A line of the semiconductor device in FIG. 2 (example 3)

FIG. 7 shows a cross-sectional view taken on the A-A line of the semiconductor device 1 in FIG. 2 (example 3) with other structure.

In an element isolation region 6 of the semiconductor device 1, a P type well layer 16d is formed between a BOX layer 11 and an STI layer 14. According to the above structure, substrate noise is easily absorbed in a second diffusion layer 26 of a guard ring region 8 because a noise source and the second diffusion layer 26 in the guard ring region 8 are electrically connected to each other through the P type well layer 16d.

As described above, the embodiments according to the present invention have been described, referring to the drawings. However, the embodiments are to be considered as illustrative and not restrictive, and various kinds of configurations other than those of the above-described embodiments may be applied.

There may be applied, for example, a semiconductor device in which there is provided one element section, and a second diffusion layer (guard ring) is provided around an element section, though the examples with the semiconductor devices formed with two element sections have been explained in the above-described explanation.

Thereby, substrate noise may be prevented from transmitting from the element section to the outside and, furthermore, influences by the substrate noise generated in the element section on the element section itself may be reduced.

Moreover, there may be applied, for example, a configuration in which a guard ring is provided around an element section 2 to be a source of the substrate noise, though the examples with the semiconductor devices formed with the guard ring around the element section 4 influenced by the substrate noise have been explained as examples in the above-described explanation.

Thereby, substrate noise may be prevented from transmitting from the element section 2 to the element section 4, and, furthermore, influences by the substrate noise from other element sections, or by the substrate noise generated in the element section 2 on the element section 2 itself may be reduced.

Moreover, there may be provided a plurality of the element sections 2, and a plurality of the element sections 4, though the examples with the semiconductor devices formed with one element section 2 as a source of the substrate noise, and one element section 4 influenced by the substrate noise have been explained as examples in the above-described explanation.

It is apparent that the present invention is not limited to the above embodiment, that may be modified and changed without departing from the scope and spirit of the invention.

What is claimed is:

1. A semiconductor device, comprising:
    a SOI substrate in which a support substrate, an insulating layer, and an SOI layer are sequentially stacked;
    an element section provided in one region of said SOI substrate; and
    a guard ring region provided around said element section of said SOI substrate,
    wherein a first diffusion layer provided in said SOI layer of said element section, and a second diffusion layer provided in said SOI layer of said guard ring region are electrically connected to each other,
    an element separation film which does not reach said insulating layer is provided in said SOI layer, in a region between said first diffusion layer and said second diffusion layer, and
    a third diffusion layer which electrically connects said first diffusion layer and said second diffusion layer is provided between said element separation film and said insulating layer.

2. The semiconductor device according to claim 1, wherein said first diffusion layer is surrounded said second diffusion layer.

3. The semiconductor device according to claim 1, wherein said second diffusion layer is provided between said element section and another element section different from said element section.

4. The semiconductor device according to claim 1, wherein said first, second, and third diffusion layers are a P type diffusion layer, and said second diffusion layer is fixed to a ground potential.

5. The semiconductor device according to Claim 4, wherein said first diffusion layer is fixed to another Ground potential which is not electrically connected to said ground potential.

6. The semiconductor device according to claim 1, wherein said first, second, and third diffusion layers are an N type diffusion layer, and said second diffusion layer is fixed to a power supply potential.

7. The. semiconductor device according to claim 6, wherein said first diffusion layer is fixed to another power supply potential which is not electrically connected to said power supply potential.

* * * * *